(12) United States Patent
Ishizaki (10) Patent No.: US 11,264,406 B2
(45) Date of Patent: Mar. 1, 2022

(54) THIN-FILM TRANSISTOR ARRAY, IMAGE DISPLAY DEVICE, AND METHOD FOR MANUFACTURING THIN-FILM TRANSISTOR ARRAY

(71) Applicant: TOPPAN PRINTING CO., LTD., Taito-ku (JP)

(72) Inventor: Mamoru Ishizaki, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 512 days.

(21) Appl. No.: 15/706,831

(22) Filed: Sep. 18, 2017

(65) Prior Publication Data

US 2018/0024391 A1 Jan. 25, 2018

Related U.S. Application Data (63) Continuation of application No. PCT/JP2016/001570, filed on Mar. 17, 2016.

(30) Foreign Application Priority Data

Mar. 18, 2015 (JP) .............................. JP2015-054712

(51) Int. Cl.
*G02F 1/1343* (2006.01)
*H01L 27/12* (2006.01)
(Continued)

(52) U.S. Cl.
CPC ........ *H01L 27/1222* (2013.01); *G02F 1/1343* (2013.01); *G02F 1/1362* (2013.01);
(Continued)

(58) Field of Classification Search
None
See application file for complete search history.

(56) References Cited

U.S. PATENT DOCUMENTS 5,652,632 A 7/1997 Shimizu
6,586,769 B1 7/2003 Watanabe et al.
(Continued)

FOREIGN PATENT DOCUMENTS

CN 101839888 A 9/2010
CN 202978237 U 6/2013
(Continued)

OTHER PUBLICATIONS

Extended European Search Report dated Jan. 19, 2018 in Patent Application No. 16764503.5, 9 pages.
(Continued)

*Primary Examiner* — Phu Vu
(74) *Attorney, Agent, or Firm* — Oblon, McClelland, Maier & Neustadt, L.L.P.

(57) ABSTRACT

A thin-film transistor array including an insulating substrate, a gate insulating film sandwiched between a first structure and a second structure, the first structure including a gate electrode, a gate wire connected to the gate electrode, a capacitor electrode, and a capacitor wire connected to the capacitor electrode, and the second structure including a source electrode, a source wire connected to the source electrode, a drain electrode, and a pixel electrode connected to the drain electrode, a resistor inserted between parts of the capacitor wire, and a semiconductor layer formed between the source electrode and the drain electrode. The pixel electrode is positioned over the capacitor electrode with the gate insulating film positioned therebetween and has a storage capacitance, and the source electrode and the drain electrode are positioned over the gate electrode with the gate insulating film positioned therebetween.

14 Claims, 9 Drawing Sheets

(51) Int. Cl.
  *H01L 21/822* (2006.01)
  *H01L 29/786* (2006.01)
  *G02F 1/1362* (2006.01)
  *G09F 9/35* (2006.01)
(52) U.S. Cl.
  CPC .......... *H01L 21/822* (2013.01); *H01L 29/786* (2013.01); *G09F 9/35* (2013.01)

(56) References Cited

U.S. PATENT DOCUMENTS

| | | | |
|---|---|---|---|
| 2001/0008434 A1* | 7/2001 | Battersby | G02F 1/136213 349/38 |
| 2001/0025958 A1* | 10/2001 | Yamazaki | H01L 29/66757 257/72 |
| 2001/0029144 A1* | 10/2001 | Adachi | G02F 1/13439 445/24 |
| 2003/0111664 A1 | 6/2003 | Watanabe et al. | |
| 2005/0051779 A1 | 3/2005 | Watanabe et al. | |
| 2005/0173732 A1* | 8/2005 | Yu | G02F 1/136286 257/202 |
| 2006/0087577 A1 | 4/2006 | Watanabe et al. | |
| 2006/0181496 A1* | 8/2006 | Yu | G09G 3/3233 345/92 |
| 2008/0197348 A1 | 8/2008 | Matsubara et al. | |
| 2009/0001379 A1 | 1/2009 | Watanabe et al. | |
| 2011/0068388 A1* | 3/2011 | Yamazaki | H01L 29/66742 257/329 |
| 2011/0183478 A1* | 7/2011 | Chung | H01L 27/1292 438/158 |
| 2014/0117363 A1* | 5/2014 | Koresawa | H01L 27/3274 257/59 |

FOREIGN PATENT DOCUMENTS

| | | |
|---|---|---|
| EP | 0 993 038 A1 | 4/2000 |
| JP | 8-101397 A | 4/1996 |
| JP | 2003-5219 A | 1/2003 |
| JP | 2008-235861 A | 10/2008 |

OTHER PUBLICATIONS

International Search Report dated May 31, 2016 in PCT/JP2016/001570, filed Mar. 17, 2016.
Combined Chinese Office Action and Search Report dated Aug. 12, 2020 in corresponding Chinese Patent Application No. 201680015974.4 (with English Translation and English Translation of Category of Cited Documents), 21 pages.

* cited by examiner

THIN-FILM TRANSISTOR ARRAY, IMAGE DISPLAY DEVICE, AND METHOD FOR MANUFACTURING THIN-FILM TRANSISTOR ARRAY

CROSS-REFERENCE TO RELATED APPLICATIONS

The present application is a continuation of International Application No. PCT/JP2016/001570, filed Mar. 17, 2016, which is based upon and claims the benefits of priority to Japanese Application No. 2015-054712, filed Mar. 18, 2015. The entire contents of these applications are incorporated herein by reference.

BACKGROUND OF THE INVENTION

Field of the Invention

The present invention relates to a thin-film transistor array, an image display device, and a method for manufacturing a thin-film transistor array.

Discussion of the Background

With the development of thin-film transistors, liquid-crystal display devices or electrophoretic display devices that use thin-film transistors are being developed. Typically, photolithography has been used when patterning thin-film transistor array electrodes.

In recent years, printed thin-film transistor arrays have attracted attention as less expensive thin-film transistor arrays, or as thin-film transistor arrays that are suitable for plastic substrates that can be processed at low temperature (JP 2008-235861 A).

However, in patterning, yield percentage is lower in printing than in photolithography, and therefore short-circuiting may occur between a gate wire and a capacitor wire.

SUMMARY OF THE INVENTION

According to an aspect of the present invention, a thin-film transistor array includes an insulating substrate, a gate insulating film sandwiched between a first structure and a second structure, the first structure including a gate electrode, a gate wire connected to the gate electrode, a capacitor electrode, and a capacitor wire connected to the capacitor electrode, and the second structure including a source electrode, a source wire connected to the source electrode, a drain electrode, and a pixel electrode connected to the drain electrode, a resistor inserted between parts of the capacitor wire, and a semiconductor layer formed between the source electrode and the drain electrode. The pixel electrode is positioned over the capacitor electrode with the gate insulating film positioned therebetween and has a storage capacitance, and the source electrode and the drain electrode are positioned over the gate electrode with the gate insulating film positioned therebetween.

According to another aspect of the present invention, a method for manufacturing a thin-film transistor array includes forming, on an insulating substrate by printing, a gate electrode, a gate wire connected to the gate electrode, a capacitor electrode, and a capacitor wire connected to the capacitor electrode, forming a resistor between parts of the capacitor wire, forming a gate insulating film on the gate electrode, the gate wire, the capacitor electrode, and the capacitor wire, forming, on the gate insulating film, a source electrode, a source wire connected to the source electrode, a drain electrode, and a pixel electrode connected to the drain electrode, and forming a semiconductor layer between the source electrode and the drain electrode.

According to still another aspect of the present invention, a method for manufacturing a thin-film transistor array includes forming, on an insulating substrate, a source electrode, a source wire connected to the source electrode, a drain electrode, and a pixel electrode connected to the drain electrode, forming a semiconductor layer between the source electrode and the drain electrode, forming a gate insulating film on the source electrode, the source wire, the drain electrode, and the pixel electrode such that the gate insulating film has an opening over the pixel electrode, forming, on the gate insulating film by printing, a gate electrode, a gate wire connected to the gate electrode, a capacitor electrode, and a capacitor wire connected to the capacitor electrode, forming a resistor between parts of the capacitor wire, forming an inter-layer insulating film on the gate insulating film, the gate electrode, the gate wire, the capacitor electrode, and the capacitor wire such that the inter-layer insulating film has an opening over the opening of the gate insulating film, and forming an upper pixel electrode on the inter-layer insulating film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

First Embodiment

Figure 1:
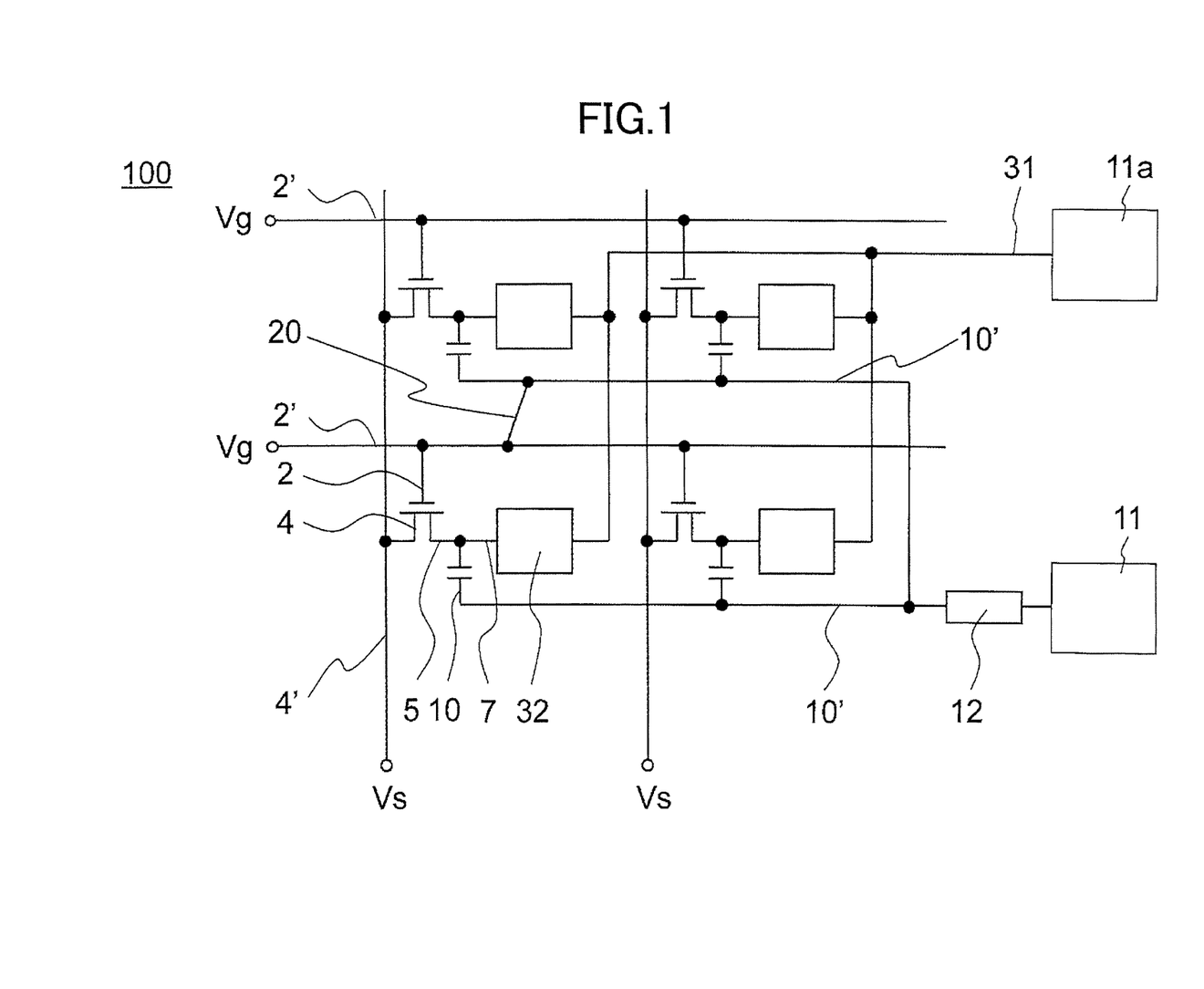
FIG. 1 is a wiring diagram illustrating a thin-film transistor array of an embodiment of the present invention.

FIG. 1 illustrates a thin-film transistor array 100 of a first embodiment. The thin-film transistor array 100 includes: an insulating substrate 1; a plurality of gate electrodes 2, a plurality of gate wires 2' connected to the gate electrodes 2, and a plurality of capacitor electrodes 10, and a plurality of capacitor wires 10' connected to the capacitor electrodes 10, which are all formed on top of the insulating substrate 1; a gate insulating film 3 which is formed on top of the insulating substrate 1, the gate electrodes 2, the gate wires 2', the capacitor electrodes 10 and the capacitor electrodes 10; and a plurality of source electrodes 4, a plurality of source wires 4' connected to the source electrodes 4, a plurality of drain electrodes 5, and a plurality of pixel electrodes 7 connected to the drain electrodes 5, which are all formed on top of the gate insulating film 3. In the thin-film transistor array 100: the pixel electrodes 7 are laid over the respective capacitor electrodes 10 via the gate insulating film 3 to have storage capacitances; the source electrodes 4 and the drain electrodes 5 are laid over the respective gate electrodes 2 via the gate insulating film 3; a semiconductor layer 6 is provided between each source electrode 4 and the corresponding drain electrode 5; and a resistor 12 is provided in part of the capacitor wires 10'. However, in FIG. 1 is illustrated as a wiring diagram for the sake of clarity.

Normally, the gate wires 2' are connected to the individual outputs of a gate driver which is connected to a gate power supply. The source wires 4' are connected to the individual outputs of a source driver which is connected to a source power supply. A counter electrode 31 is connected to a common power supply 11a. All the capacitor wires 10' connected to the respective storage capacitances are bundled into a wire, for connection to a capacitor power supply 11. However, the common power supply 11a may serve as the capacitor power supply 11, or may be directly connected to a ground potential (GND) without the capacitor power supply 11. Generally, it is considered desirable for a wire resistance to be small so that a desired voltage is correctly applied.

Figure 7:
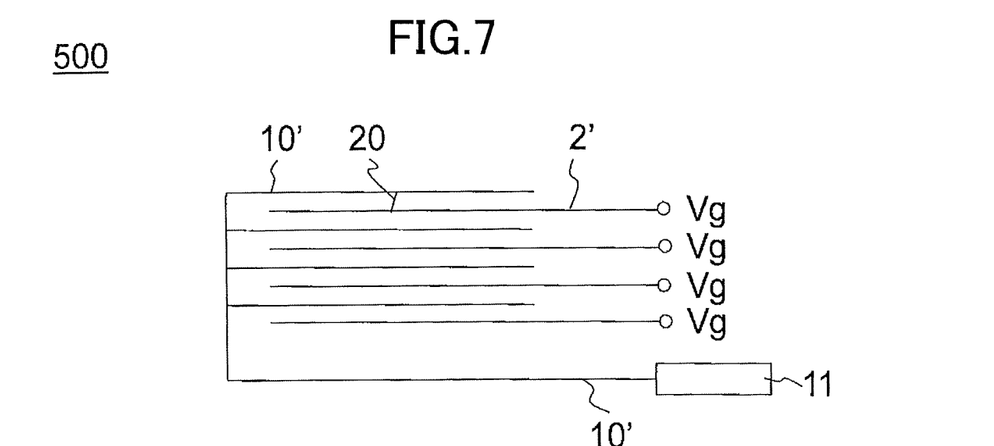
FIG. 7 is a wiring diagram illustrating a thin-film transistor array according to conventional technology.

FIG. 7 is a wiring diagram illustrating gate wires 2' and capacitor wires 10' in a conventional thin-film transistor array 500. In the conventional thin-film transistor array 500, when there is short-circuiting 20 between a gate wire 2' and a capacitor wire 10', or when short-circuiting 20 occurs due to causes after manufacture, a high current flows from the gate power supply→gate driver→gate wire 2'→capacitor wire 10'→capacitor power supply 11, and the gate power supply, the gate driver or the capacitor power supply 11 may fail. When the common power supply 11a also serves as the capacitor power supply 11, the gate power supply, the gate driver or the common power supply 11a may fail. When the capacitor power supply 11 is grounded (GND), the gate power supply or gate driver may fail.

However, when the thin-film transistor array 100 is provided with the resistor 12 which is placed in part of the capacitor wires 10', the current flowing through the gate driver is limited even where there is short-circuiting 20 between a gate wire 2' and a capacitor wire 10'. Thus, failure of the gate power supply, the gate driver or the capacitor power supply 11 is prevented. The resistor 12 provided in part of the capacitor wires 10' is preferably provided to a portion where the plurality of capacitor wires 10' are bundled into a wire. With this arrangement, all the gate drivers are protected with one resistor 12.

Short-circuiting 20 between a gate wire 2' and a capacitor wire 10' may occur when the gate electrodes 2, the gate wires 2', the capacitor electrodes 10 and capacitor wires 10' are collectively printed. This is because yield percentage in printing is low compared to photolithography. Usually, such short-circuiting does not occur in photolithography. However, while photolithography requires many steps of film formation→resist coating→pre-baking→exposure→development→post-baking→etching→resist peeling, printing requires only simple steps of printing→baking. Accordingly, printing is inexpensive, and can use low-temperature processing, to thereby provide a flexible thin-film transistor array using a plastic substrate. In other words, a thin-film transistor array prepared by printing has different advantages than those of a thin-film transistor array prepared by photolithography. The present invention is a technology that is unique and effective when a thin-film transistor array is prepared through such printing. However, the present invention may be applied to a thin-film transistor array prepared through photolithography.

The resistor 12 is required to have an electrical resistance value R which is smaller than a value obtained by dividing the frame time by the sum of all the storage capacitances Cs connected to the capacitor wires 10'. A relation R<Tf/(MNCs) can be established, where Tf is a frame time, Cs is a storage capacitance of one pixel, M is the number of pixels in one line, and N is the number of scanning lines. This is based on the fact that a time constant RMCs for charging a storage capacitance of one line is smaller than a selection time Tf/N when the resistances of the gate wire 2' and the capacitor wire 10' are ignored.

Also, the electrical resistance value R of the resistor 12 is required to be larger than a value obtained by dividing an absolute value of a voltage between the gate wire and the capacitor wire by a maximum allowable output current of the gate driver. A relation R>|Vgc|/Ig(max) can be established, where Vgc is a gate-capacitor voltage, and Ig(max) is a maximum allowable output current of the gate driver.

Figure 2A:
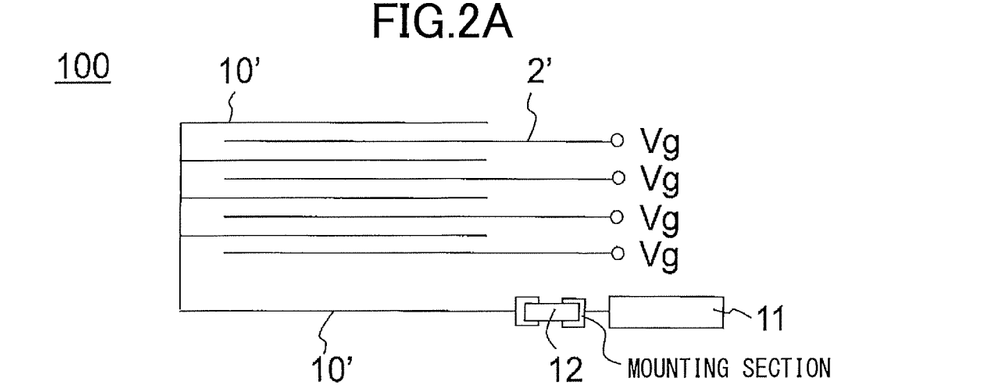
FIG. 2A is a wiring diagram illustrating a thin-film transistor array of an embodiment of the present invention.
Figure 2B:
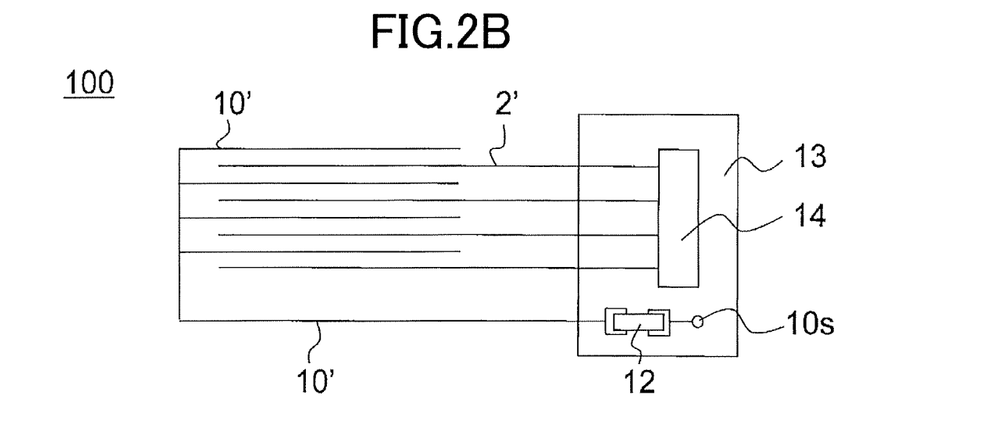
FIG. 2B is a wiring diagram illustrating a thin-film transistor array of an embodiment of the present invention.

Examples of specific modes of the thin-film transistor array 100 are schematically illustrated in FIGS. 2A and 2B. As shown, the resistor 12 is provided to a part of the capacitor wires 10'. In FIG. 2A, a mounting section is provided in part of the capacitor wires 10' on the substrate 1, and a chip resistor 12, which is a separate element, is connected to the mounting section using Ag paste. In FIG. 2B, a chip resistor 12, which is a separate element, is soldered to a part of the capacitor wiring on a flexible circuit board 13, which wiring is connected to the capacitor wires 10' on the substrate 1.

FIGS. 3A to 3G illustrate an example of a method for manufacturing the thin-film transistor array 100. In each figure, the left diagram is a wiring diagram of the entire thin-film transistor array 100, the middle diagram is a top view of a pixel corresponding to a single thin-film transistor of the thin-film transistor array 100, and the right diagram is a cross section taken along the line A-B of the pixel. The overall wiring diagram shows the gate wires 2', the capacitor wires 10' and the resistor 12, but omits the gate electrodes 2, the capacitor electrodes 10, the gate insulating film 3, the source electrodes 4, the source wires 4', the drain electrodes 5, the pixel electrodes 7, the semiconductor layer 6, and a protective layer 6'.

Figure 3A:
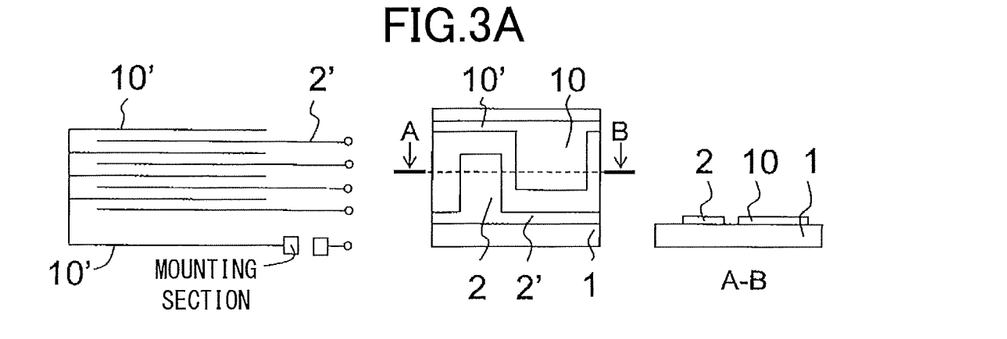
FIG. 3A is a set of schematic diagrams illustrating a method for manufacturing a thin-film transistor array of an embodiment of the present invention.

First, the gate electrodes 2, the gate wires 2' connected to the gate electrodes 2, the capacitor electrodes 10, and the capacitor wires 10' connected to the capacitor electrodes 10 and provided with a mounting section for the resistor 12 are formed on the insulating substrate 1 by printing (FIG. 3A). Materials that can be used for the insulating substrate 1 include inorganic materials, such as glass, or organic materials, such as polyethylene terephthalate (PET), polyethylene naphthalate (PEN), polyethersulfone (PES), polyimide (PI), polyetherimide (PEI), and the like. The gate electrodes 2, the gate wires 2', the capacitor electrodes 10, and the capacitor wires 10' are preferably made of a material, such as Ag, Cu, Au, Pt, or the like; however carbon, ITO, or the like is also usable. The printing method may be offset printing, relief printing, intaglio printing, screen printing, inkjet printing, or the like. Of these printing methods, offset printing is preferred, and particularly, inverse offset printing or gravure offset printing is preferred.

Figure 3B:
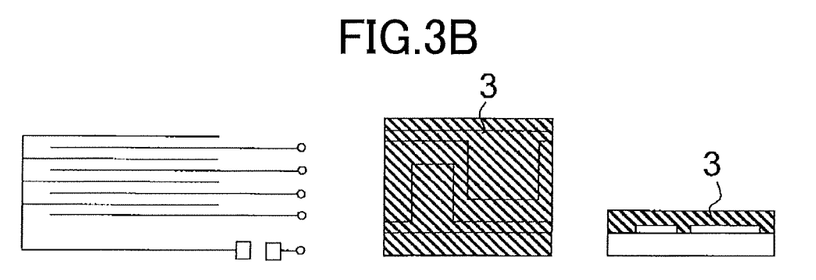
FIG. 3B is a set of schematic diagrams illustrating a method for manufacturing a thin-film transistor array of an embodiment of the present invention.

Then, the gate insulating film 3 is formed on top of the insulating substrate 1, the gate electrodes 2, the gate wires 2', the capacitor electrodes 10, and the capacitor wires 10' (FIG. 3B). The gate insulating film 3 is formed covering substantially the entirety of these elements, except for the gate connecting sections and the capacitor connecting sections. Materials that can be used for the gate insulating film 3 include inorganic insulating films such as of $SiO_2$, SiN, and the like, and organic insulating films such as of polyvinylphenol, epoxy, and the like. The insulating film 3 can be formed by sputtering, or by applying and baking a liquid agent.

Figure 3C:
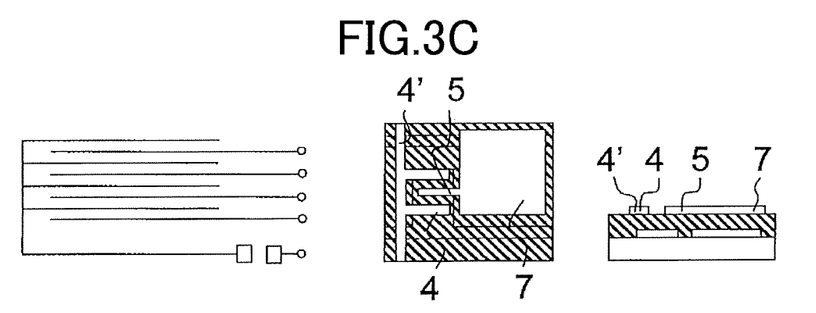
FIG. 3C is a set of schematic diagrams illustrating a method for manufacturing a thin-film transistor array of an embodiment of the present invention.

Then, the source electrodes 4, the source wires 4' connected to the source electrodes 4, the drain electrodes 5, and the pixel electrodes 7 connected to the drain electrodes 5 are formed on top of the gate insulating film 3 by printing (FIG. 3C). The source electrodes 4 and the drain electrodes 5 are laid over the gate electrodes 2 via the gate insulating film 3. The pixel electrodes 7 are laid over the capacitor electrodes 10 via the gate insulating film 3. The source electrodes 4, the source wires 4', the drain electrodes 5 and the pixel electrodes 7 are preferably made of a a metal, such as Ag, Cu, Au, Pt, or the like, however, carbon or ITO, or the like is also usable. The printing method may be offset printing, relief printing, intaglio printing, screen printing, inkjet printing, or the like. Of these printing methods, offset printing is preferred, and particularly, inverse offset printing or gravure offset printing is preferred.

Figure 3D:
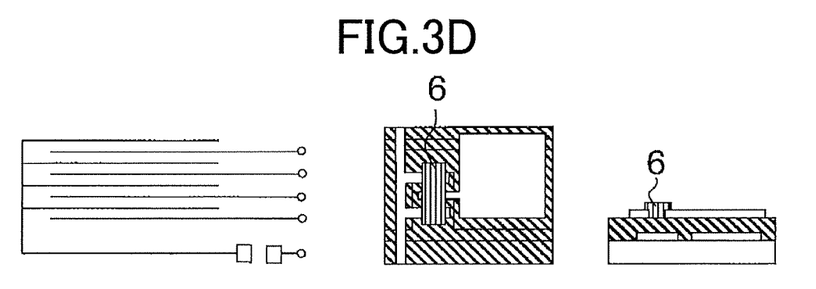
FIG. 3D is a set of schematic diagrams illustrating a method for manufacturing a thin-film transistor array of an embodiment of the present invention.
Figure 3E:
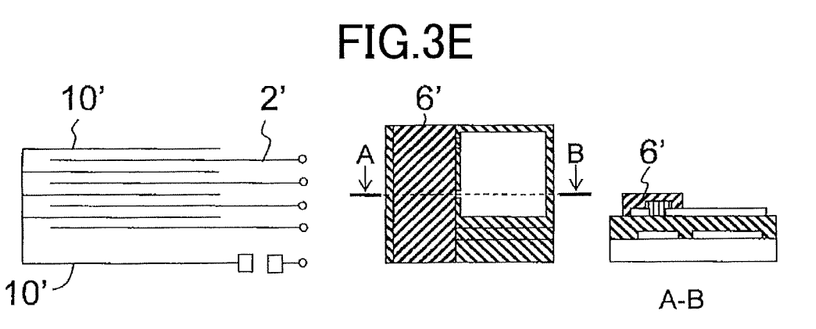
FIG. 3E is a set of schematic diagrams illustrating a method for manufacturing a thin-film transistor array of an embodiment of the present invention.

Then, the semiconductor layer 6 is formed on top of the gate insulating film 3, the source electrodes 4, and the drain electrodes 5, which includes an area between the source electrodes 4 and the drain electrodes 5 (FIG. 3D), followed by forming a protective layer 6' so as to cover the semiconductor layer 6 (FIG. 3E). Materials that can be used for the semiconductor layer 6 include silicon semiconductors, oxide semiconductors, organic semiconductors, and the like. The semiconductor layer 6 can be formed by CVD, sputtering, or printing. Materials that can be used for the protective layer 6' include $SiO_2$, SiN, and fluororesins. The protective layer 6' can be formed by CVD, sputtering, or printing. As illustrated in FIG. 3E, when the protective layer 6' completely covers the source electrodes 4 and the source wires 4', an interlayer insulating film 8 and upper pixel electrodes 9 may be omitted. In that case, the pixel electrodes 7 are used as effective display regions.

Figure 3F:
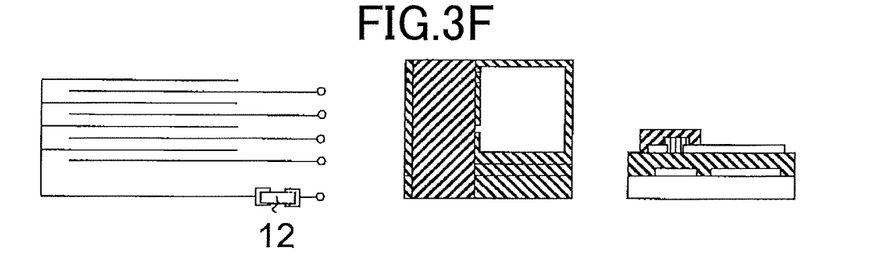
FIG. 3F is a set of schematic diagrams illustrating a method for manufacturing a thin-film transistor array of an embodiment of the present invention.

Then, a resistor 12 is mounted to a part of the capacitor wires 10' (FIG. 3F). The resistor 12 can be easily mounted by using Ag paste or the like.

Figure 3G:
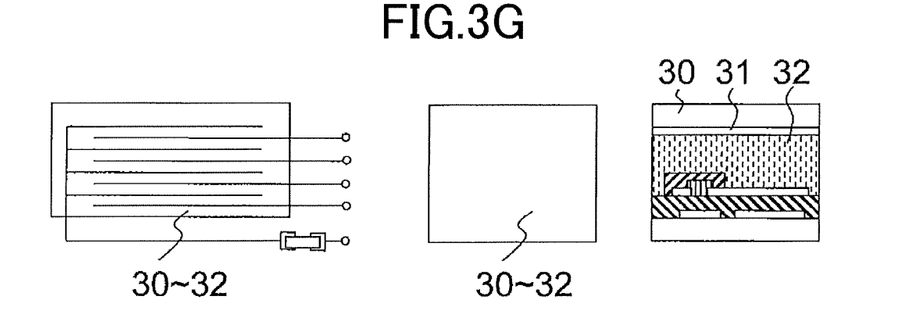
FIG. 3G is a set of schematic diagrams illustrating a method for manufacturing a thin-film transistor array of an embodiment of the present invention.

Then, a display medium 32 is placed between the thin-film transistor array 100 prepared in this way and a counter electrode 31 on a counter substrate 30 prepared separately, to form an image display device (panel) (FIG. 3G). Materials that can be used for the display medium 32 include liquid crystal, electrophoretic materials, electrochromic materials, and the like. In the case of liquid crystal, normally light is controlled by combining the liquid crystal with a polarizing plate. In the case of polymer dispersed liquid crystal, an electrophoretic material, or an electrochromic material, no polarizing plate is necessary.

Second Embodiment

Figure 4:
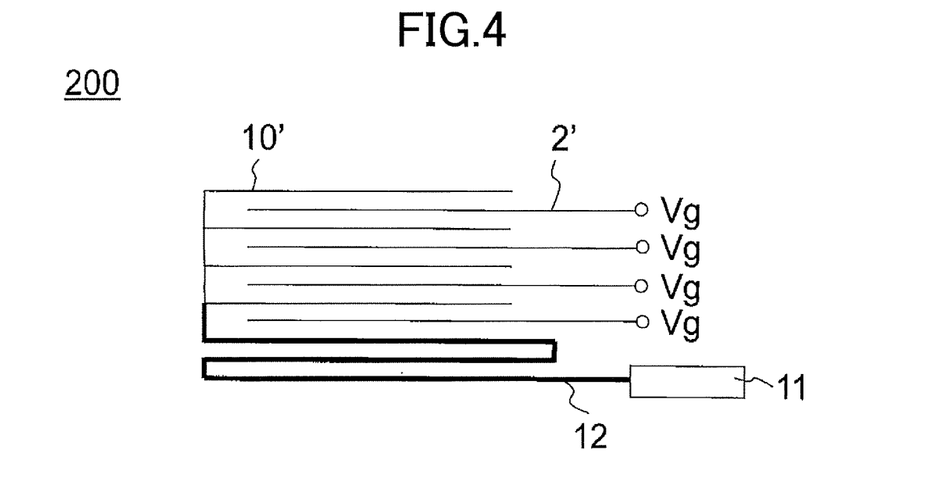
FIG. 4 is a wiring diagram illustrating a thin-film transistor array according to an embodiment of the present invention.

FIG. 4 illustrates a thin-film transistor array 200 of a second embodiment. The thin-film transistor array 200 includes: an insulating substrate 1; a plurality of gate electrodes 2, a plurality of gate wires 2' connected to the gate electrodes 2, a plurality of capacitor electrodes 10, a plurality of capacitor wires 10' connected to the capacitor electrodes 10, which are all formed on top of the insulating substrate 1; a gate insulating film 3 which is formed on top of the insulating substrate 1, the gate electrodes 2, the gate wires 2', the capacitor electrodes 10 and the capacitor electrodes 10; a plurality of source electrodes 4, a plurality of source wires 4' connected to the source electrodes 4, a plurality of drain electrodes 5, and a plurality of pixel electrodes 7 connected to the drain electrodes 5, which are all formed on top of the gate insulating film 3. In the thin-film transistor array 200: the pixel electrodes 7 are laid over the respective capacitor electrodes 10 via the gate insulating film 3 to have storage capacitances; the source electrodes 4 and the drain electrodes 5 are laid over the respective gate electrodes 2 via the gate insulating film 3; a semiconductor layer 6 is provided between each source electrode 4 and the corresponding drain electrode 5; a resistor 12 is provided in part of the capacitor wires 10'. The resistor 12 is formed by printing concurrently with the gate electrodes 2, the gate wires 2', the capacitor electrodes 10 and the capacitor wires 10'. The thin-film transistor array 200 and the thin-film transistor array 100 differ in the formation method and the structure of the resistor 12, and the rest of the structure is the same. Therefore, FIG. 4 shows only the gate wires 2', the capacitor wires 10' and the resistor 12, and the rest of the structure is omitted.

In the thin-film transistor array 200, the resistor 12 can be formed using the same material and the same processes as the gate electrodes 2, the gate wires 2', the capacitor electrodes 10 and the capacitor wires 10'. Therefore, the gate power supply, the gate drivers, and the capacitor power supply 11 can be protected without increasing the processing steps.

Similarly to the first embodiment, the electrical resistance value R of the resistor 12 is smaller than the value obtained by dividing the frame time by the sum of all the storage capacitances Cs connected to the capacitor wires 10', and is larger than a value obtained by dividing the absolute value of the gate-capacitor voltage by the maximum allowable output current of the gate drivers.

The method for manufacturing the thin-film transistor array 200 is illustrated in FIGS. 5A to 5H. In each figure, the left diagram is a wiring diagram of the entire thin-film transistor array 200, the middle diagram is a top view of a pixel corresponding to a single thin-film transistor element of the thin-film transistor array 200, and the right diagram is a cross section taken along the line A-B of the pixel. The overall wiring diagram shows the gate wires 2', the capacitor wires 10' and the resistor 12, but omits the gate electrodes 2, the capacitor electrodes 10, the gate insulating film 3, the source electrodes 4, the source wires 4', the drain electrodes 5, the pixel electrodes 7, the semiconductor layer 6 and the protective layer 6'.

Figure 5A:
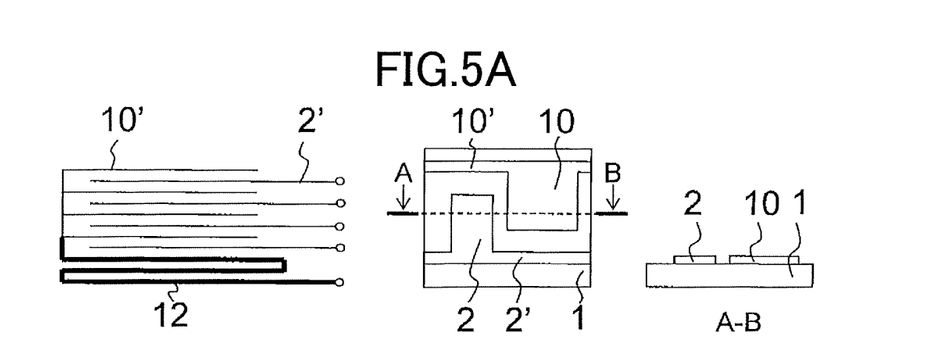
FIG. 5A is a set of schematic diagrams illustrating a method for manufacturing a thin-film transistor array of an embodiment of the present invention.

First, the gate electrodes 2, the gate wires 2' connected to the gate electrodes 2, the capacitor electrodes 10, the capacitor wires 10' connected to the capacitor electrodes 10, and the resistor 12 are formed on top of the insulating substrate 1 by printing (FIG. 5A). The resistor 12 is provided in the form of a long wiring portion so as to satisfy the electrical resistance value R. The long wiring portion is formed by meanderingly wiring the plurality of capacitor wires 10' that have been bundled into a wire with an adjustment in the length. However, the resistor 12 is not limited to such meandering wiring. As long as the resistance has a specified value, the wiring does not have to be meandering. The width of the resistor 12 portion may be smaller than the width of the capacitor wire 10'; however, if the width is too small, there is a possibility that the resistor 12 will burn out due to current, so care must be taken.

Materials that can be used for the insulating substrate 1 include inorganic materials, such as glass, and the like, or organic materials, such as polyethylene terephthalate (PET), polyethylene naphthalate (PEN), polyethersulfone (PES), polyimide (PI), polyetherimide (PEI,) and the like. The gate electrodes 2, the gate wires 2', the capacitor electrodes 10, the capacitor wires 10' and the resistor 12 are preferably made of a metal, such as Ag, Cu, Au, Pt, or the like; however carbon, ITO, or the like may be used. The printing method may be offset printing, relief printing, intaglio printing, screen printing, inkjet printing, or the like; however, offset printing is preferred, and particularly, inverse offset printing or gravure offset printing is preferred.

Figure 5B:
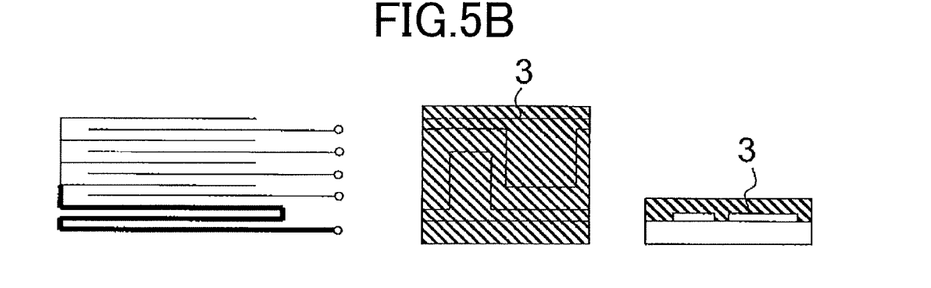
FIG. 5B is a set of schematic diagrams illustrating a method for manufacturing a thin-film transistor array of an embodiment of the present invention.

Then, a gate insulating film 3 is formed on top of the insulating substrate 1, the gate electrodes 2, the gate wires 2', the capacitor electrodes 10 and the capacitor wires 10' (FIG. 5B). The gate insulating film 3 is formed over substantially the entire surface, except for the gate connecting sections or the capacitor connecting sections. Materials that can be used for the gate insulating film 3 include inorganic insulating films such as of $SiO_2$, SiN, and the like, or organic insulating films such as of polyvinylphenol, epoxy, and the like. The insulating film 3 can be formed by application and baking of a liquid agent.

Figure 5C:
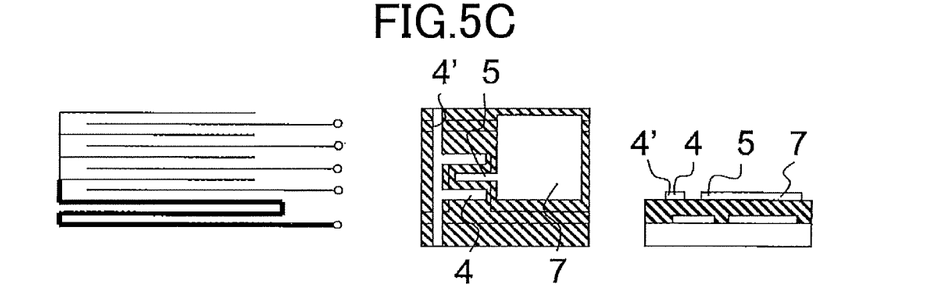
FIG. 5C is a set of schematic diagrams illustrating a method for manufacturing a thin-film transistor array of an embodiment of the present invention.

Then, the source electrodes 4, the source wires 4' connected to the source electrodes 4, the drain electrodes 5, and the pixel electrodes 7 connected to the drain electrodes 5 are formed on top of the gate insulating film 3 by printing (FIG. 5C). The source electrodes 4 and the drain electrodes 5 are laid over the gate electrodes 2 via the gate insulating film 3. The pixel electrodes 7 are laid over the capacitor electrodes 10 via the gate insulating film 3. The source electrodes 4, the source wires 4', the drain electrodes 5 and the pixel electrodes 7 are preferably made of a metal, such as Ag, Cu, Au, Pt, or the like; however, carbon, ITO, or the like may be used. The printing method may be offset printing, relief printing, intaglio printing, screen printing, inkjet printing, or the like; however, offset printing is preferred, and particularly, inverse offset printing or gravure offset printing is preferred.

Figure 5D:
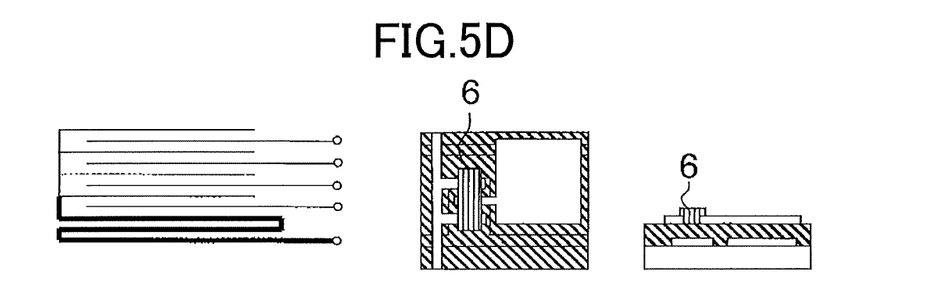
FIG. 5D is a set of schematic diagrams illustrating a method for manufacturing a thin-film transistor array of an embodiment of the present invention.
Figure 5E:
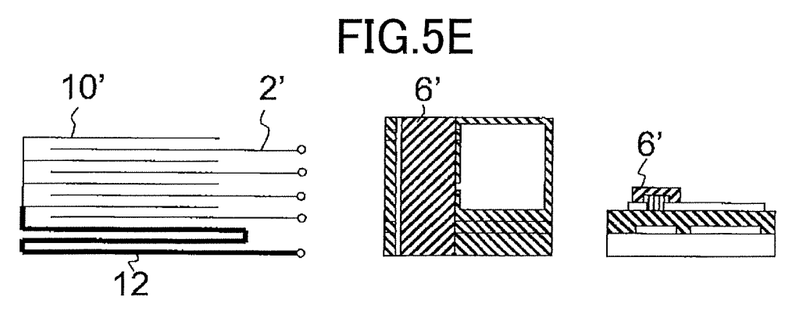
FIG. 5E is a set of schematic diagrams illustrating a method for manufacturing a thin-film transistor array of an embodiment of the present invention.

Then, the semiconductor layer 6 is formed in an area that includes on top of the gate insulating film 3, the source electrodes 4, the drain electrodes 5, and between each source electrode 4 and the corresponding drain electrode 5 (FIG. 5D), followed by forming the protective layer 6' so as to cover the semiconductor layer 6 (FIG. 5E). Materials that can be used for the semiconductor layer 6 include silicon semiconductors, oxide semiconductors, organic semiconductors, and the like. The semiconductor layer 6 can be formed by CVD, sputtering, or printing. Materials that can be used for the protective layer 6' include $SiO_2$, SiN, and fluororesins. The protective layer 6' can be formed by CVD, sputtering, or printing.

Figure 5F:
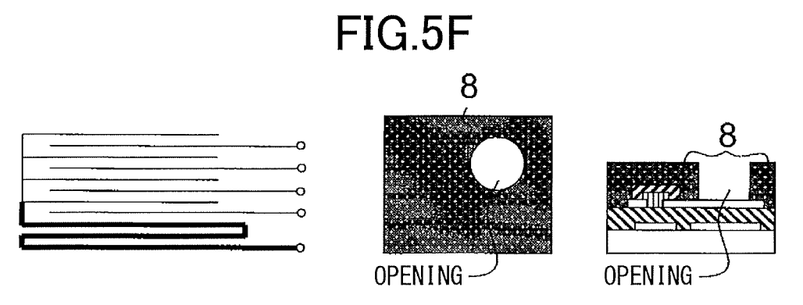
FIG. 5F is a set of schematic diagrams illustrating a method for manufacturing a thin-film transistor array of an embodiment of the present invention.

Then, the inter-layer insulating film 8 having openings is formed on top of the pixel electrodes 7 (FIG. 5F). When the protective layer 6' does not completely cover the source electrodes 4 and the source wires 4', the inter-layer insulating film 8 preferably covers the portions not otherwise covered. The material for the inter-layer insulating film 8 is preferably an organic insulating film such as of epoxy, or the like. The inter-layer insulating film 8 can be formed by printing, such as screen printing, or the like.

Figure 5G:
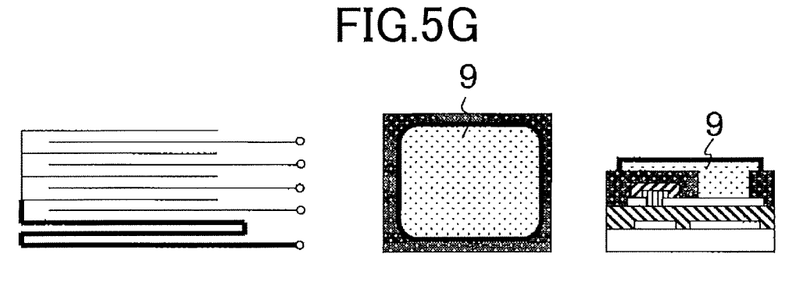
FIG. 5G is a set of schematic diagrams illustrating a method for manufacturing a thin-film transistor array of an embodiment of the present invention.

Then, the upper pixel electrodes 9 are formed on top of the inter-layer insulating film 8 (FIG. 5G). The upper pixel electrodes 9 are connected to the respective pixel electrodes 7 via the respective openings of the inter-layer insulating film 8. The material for the upper pixel electrodes 9 is preferably Ag paste, carbon paste, or the like. The upper pixel electrodes 9 can be formed by printing, such as screen printing, or the like.

When the thin-film transistor array 200 has upper pixel electrodes 9, the upper pixel electrodes 9 serve as effective display areas. When the inter-layer insulating film 8 is the top of the thin-film transistor array 200, without forming the upper layer electrodes 9, the openings of the inter-layer insulating film 8 serve as effective display areas.

Figure 5H:
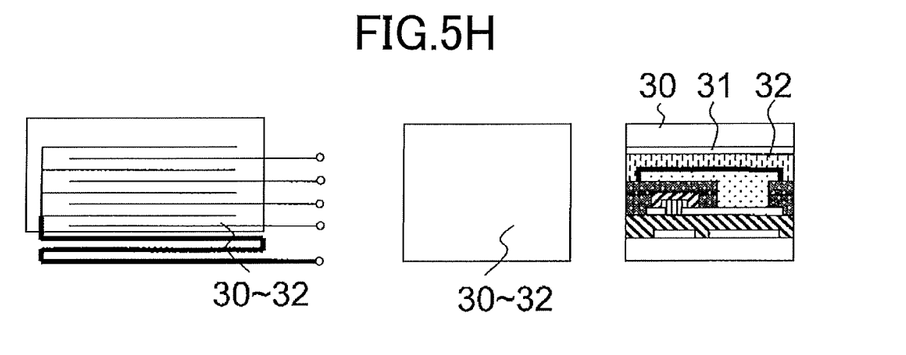
FIG. 5H is a set of schematic diagrams illustrating a method for manufacturing a thin-film transistor array of an embodiment of the present invention.

Then, the display medium 32 is placed between the thin-film transistor array 200 prepared in this way and a counter electrode 31 on a counter substrate 30 prepared separately to provide an image display device (panel) (FIG. 5H). Materials that can be used for the display medium 32 include liquid crystal, electrophoretic materials, electrochromic materials, and the like. In the case of liquid crystal, conventionally, light has been controlled by combining the liquid crystal with a polarizing plate. In the case of polymer dispersed liquid crystal, an electrophoretic material, or an electrochromic material, no polarizing plate is necessary.

The thin-film transistor array 100 or 200 and the manufacturing method therefor do not limit the structure to a bottom gate structure in which the gate electrodes 2 are provided further toward the substrate 1 side than the source gates 4 and the drain gates 5, but may be applied to a top gate structure in which the source electrodes 4 and drain electrodes 5 are provided further toward the substrate 1 side than the gate electrodes 2. Moreover, the thin-film transistor array 100 or 200 and the manufacturing method therefor do not limit the structure to a bottom contact structure in which the semiconductor layer 6 is formed on top of the source electrodes 4 and the drain electrodes 5, but may be applied to a top contact structure in which the source electrodes 4 and the drain electrodes 5 are formed on top of the semiconductor layer 6.

Figure 6A:
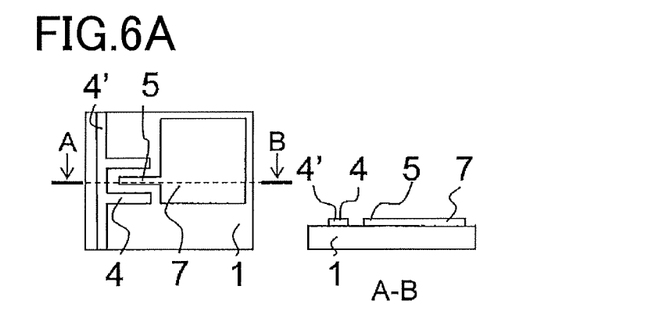
FIG. 6A is a set of schematic diagrams illustrating a method for manufacturing a thin-film transistor array of an embodiment of the present invention.

An example of the manufacturing method in the case in which the thin-film transistor array 200 is a top gate structure is illustrated in FIGS. 6A to. 6G. In each figure, the left diagram is a wiring diagram of the entire thin-film transistor array 200, the middle diagram is a top view of a pixel corresponding to a single thin-film transistor element of the thin-film transistor array 200, and the right diagram is a cross-sectional view taken along the line A-B of the pixel. The overall wiring diagram shows the gate wires 2', the capacitor wires 10' and the resistor 12, but omits the gate electrodes 2, the capacitor electrodes 10, the gate insulating film 3, the source electrodes 4, the source wires 4', the drain electrodes 5, the pixel electrodes 7, the semiconductor layer 6 and the protective layer 6'.

First, the source electrodes 4, the source wires 4' connected to the source electrodes 4, the drain electrodes 5, and the pixel wires 7 connected to the drain electrodes 5 are formed on the top of the insulating substrate 1 by printing (FIG. 6A).

Materials that can be used for the insulating substrate 1 include inorganic materials, such as glass, and the like, or organic materials, such as polyethylene terephthalate (PET), polyethylene naphthalate (PEN), polyethersulfone (PES), polyimide (PI), polyetherimide (PEI) and the like. The source electrodes 4, the source wires 4', the drain electrodes 5, and the pixel electrodes 7 are preferably made of a metal, such as Ag, Cu, Au, Pt, or the like; however carbon, ITO, or the like may be used. The printing method may be offset printing, relief printing, intaglio printing, screen printing, inkjet printing or the like; however, offset printing is preferred, and particularly, inverse offset printing or gravure offset printing is preferred.

Figure 6B:
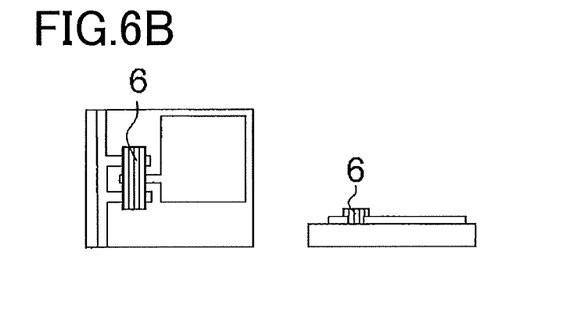
FIG. 6B is a set of schematic diagrams illustrating a method for manufacturing a thin-film transistor array of an embodiment of the present invention.

Then, the semiconductor layer 6 is formed in an area between the source electrodes 4 and the drain electrodes 5 (FIG. 6B). Materials that can be used for the semiconductor layer 6 include silicon semiconductors, oxide semiconductors, organic semiconductors, and the like. The semiconductor layer 6 can be formed by CVD, sputtering, or printing.

Figure 6C:
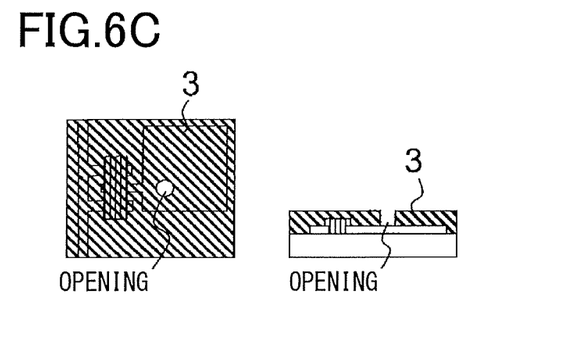
FIG. 6C is a set of schematic diagrams illustrating a method for manufacturing a thin-film transistor array of an embodiment of the present invention.

Then, the gate insulating film 3 is formed on top of the insulating substrate 1, the source electrodes 4, the source wires 4', the drain electrodes 5, the pixel electrodes 7 and the semiconductor layer 6 (FIG. 6C). However, the gate insulating film 3 has openings above the pixel electrodes 7. The gate insulating film 3 is not formed on top of the gate connecting sections or the capacitor connecting sections. Materials that can be used for the gate insulating film 3 include inorganic insulating films such as of $SiO_2$, SiN, and the like, and organic insulating films such as of polyvinylphenol, epoxy, and the like. The insulating film 3 can be formed by sputtering, or application and baking of a liquid agent. By providing openings in a material film mentioned above using photolithography, the gate insulating film 3 is formed. Alternatively, the gate insulating film 3 may be formed by application of a photosensitive resin, followed by exposure and development.

Figure 6D:
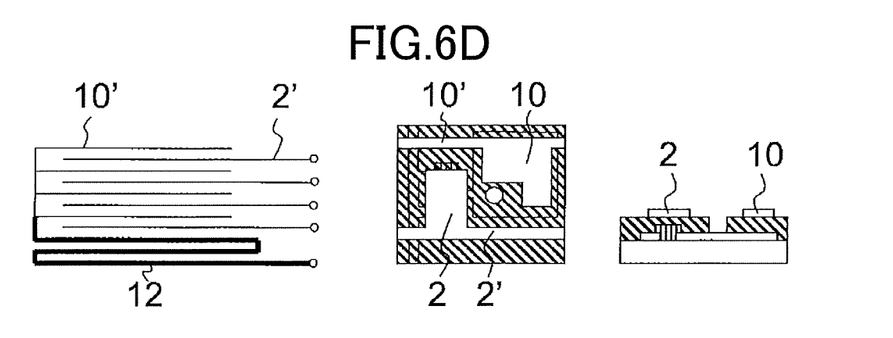
FIG. 6D is a set of schematic diagrams illustrating a method for manufacturing a thin-film transistor array of an embodiment of the present invention.

Then, the gate electrodes 2, the gate wires 2' connected to the gate electrodes 2, the capacitor electrodes 10, the capacitor wires 10' connected to the capacitor electrodes 10, and the resistor 12 are formed on top of the gate insulating film 3 by printing (FIG. 6D). The gate electrodes 2 are laid over the source electrodes 4 and the drain electrodes 5 via the gate insulating film 3. The capacitor electrodes 10 are laid over the pixel electrodes 7 via the gate insulating film 3. The resistor 12 is provided in the form of a long wiring portion so as to satisfy the electrical resistance value R. The long wiring portion is formed by meanderingly wiring the plurality of capacitor wires 10' that have been bundled into a strand with an adjustment in the length. However, the resistor 12 is not limited to such meandering wiring. As long as the resistance has a specified value, the wiring does not have to be meandering. The width of the resistor 12 portion may be smaller than the width of the capacitor wire 10; however, if the width is too small, there is a possibility that the resistor 12 will burn out due to current, so care must be taken.

The gate electrodes 2, the gate wires 2', the capacitor electrodes 10, the capacitor wires 10' and the resistor 12 are preferably made of a metal, such as Ag, Cu, Au, Pt, or the like; carbon, ITO, or the like may be used. The printing method may be offset printing, relief printing, intaglio printing, screen printing, inkjet printing, or the like; however, offset printing is preferred, and particularly, inverse offset printing or gravure offset printing is preferred.

Figure 6E:
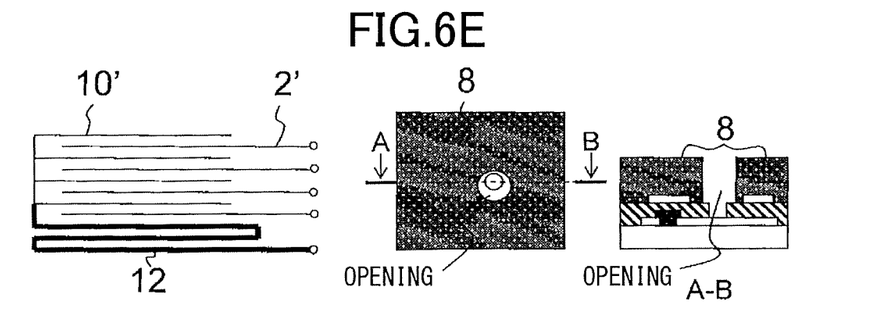
FIG. 6E is a set of schematic diagrams illustrating a method for manufacturing a thin-film transistor array of an embodiment of the present invention.

Then, an inter-layer insulating film 8 having openings is formed on top of the pixel electrodes 7 (FIG. 6E). The openings in the inter-layer insulating film 8 are provided in alignment with the respective openings in the gate insulating film 3. The material for the inter-layer insulating 8 is preferably an organic insulating film such as of epoxy, or the like. The inter-layer insulating film 8 can be formed by printing, such as screen printing, or the like.

Figure 6F:
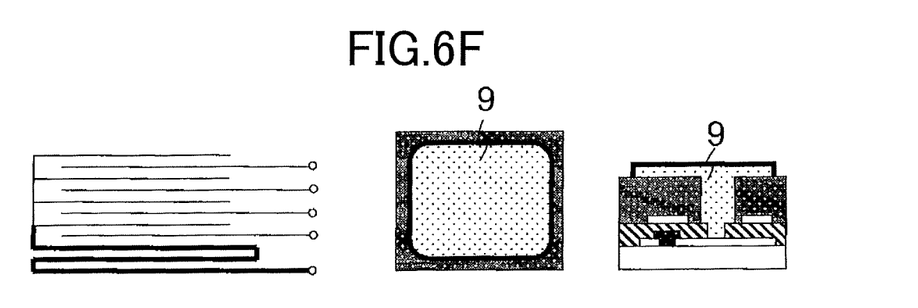
FIG. 6F is a set of schematic diagrams illustrating a method for manufacturing a thin-film transistor array of an embodiment of the present invention.

Then, the upper pixel electrodes 9 are formed on top of the inter-layer insulating film 8 (FIG. 6F). The upper pixel electrodes 9 are connected to the respective pixel electrodes 7 via the openings in the inter-layer insulating film 8 and the openings in the gate insulating film 3. The material for the upper pixel electrodes 9 may preferably be Ag paste, carbon paste, or the like. The upper pixel electrodes 9 can be formed by printing, such as screen printing, or the like.

When the thin-film transistor array 200 has upper pixel electrodes 9, the upper pixel electrodes 9 serve as effective display areas.

Figure 6G:
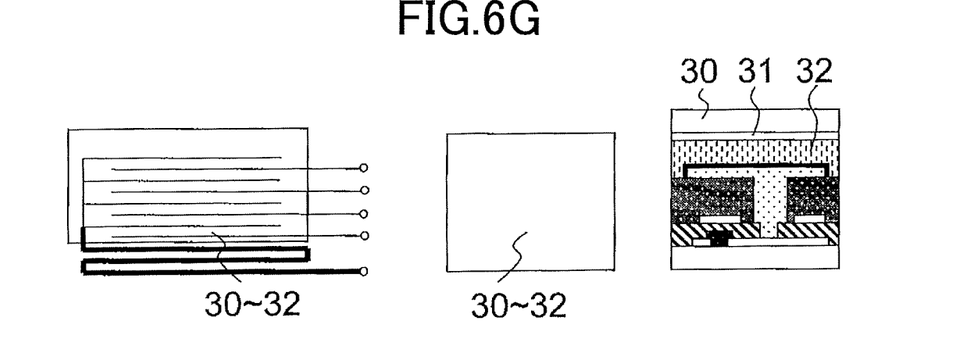
FIG. 6G is a set of schematic diagrams illustrating a method for manufacturing a thin-film transistor array of an embodiment of the present invention.

Then, the display medium 32 is placed between the thin-film transistor array 200 prepared in this way and a counter electrode 31 on the counter substrate 30 prepared separately to provide an image display device (panel) (FIG. 6G). Materials that can be used for the display medium 32 include liquid crystal, electrophoretic materials, electrochromic materials, and the like. In the case of liquid crystal, conventionally, light has been controlled by combining the liquid crystal with a polarizing plate. In the case of polymer dispersed liquid crystal, an electrophoretic material, or an electrochromic material, no polarizing plate is necessary.

EXAMPLES

Example 1

A specific example will be described. As Example 1, the thin-film transistor array 100 illustrated in FIG. 2A was prepared through the steps illustrated in FIGS. 3A to 3G. First, using a glass substrate as the insulating substrate 1, Ag ink was off-set printed thereto, followed by baking, thereby forming the gate electrodes 2, the gate wires 2', the capacitor electrodes 10, and the capacitor wires 10' (FIG. 3A).

Then, a polyvinylphenol solution was applied to the resultant object by die coating, followed by baking, thereby forming the gate insulating film 3 (FIG. 3B).

Then, Ag ink was offset-printed to the resultant object, followed by baking, thereby forming the source electrodes 4, the source wires 4', the drain electrodes 5, and the pixel electrodes 7 (FIG. 3C). Then, a polythiophene type organic semiconductor solution was printed to the resultant object by flexographic printing, followed by baking, thereby forming the semiconductor layer 6 (FIG. 3D). Then, a fluorine-based resin solution was screen-printed to the resultant object, followed by baking, thereby forming the protective layer 6' (FIG. 3E).

Then, a 10 kΩ chip resistor 12 was mounted to a mounting section of the capacitor wires 10' using Ag paste (FIG. 3F).

Separately, using a PEN substrate as a counter substrate 30, ITO was sputtered thereon to form the counter electrode. Then, a polymer dispersed liquid-crystal material was placed between the counter electrode 31 side of the counter substrate 30 and the thin-film transistor array section, as the display medium 32, followed by UV-curing (FIG. 3G).

A plurality of panels were prepared through the same steps, and were driven at a frame time of 16.7 ms. The number of pixels was 640×480, the storage capacitance was 1 pF per pixel, the gate voltage was +10 V (when not selected) or −10 V (when selected), and the capacitor voltage was the same as the counter voltage and was +3 V. The maximum allowable current of the gate drivers was about 5 mA. A proper display was obtained in panels in which there was no short-circuiting between gate wires 2' and capacitor wires 10'. In some panels, there was a short-circuiting 20 between gate wire 2' and capacitor wire 10', so the display quality was poor. However, the gate power supply, the gate drivers, and the capacitor power supply 11 did not fail and could be used for other normal panels.

Example 2

As Example 2, the thin-film transistor array 200 illustrated in FIG. 4 was prepared through the steps illustrated in FIGS. 5A to 5H. First, using a PEN substrate as the insulating substrate 1, Ag ink was offset-printed thereto, followed by baking, thereby forming the gate electrodes 2, the gate wires 2', the capacitor electrodes 10, the capacitor wires 10' and the resistor 12 (FIG. 5A). The resistance of the resistor 12 was 10 kΩ.

Then, a polyvinylphenol solution was die-coated to the resultant object, followed by baking, thereby forming the gate insulating film 3 (FIG. 5B).

Then, Ag ink was offset-printed to the resultant object, followed by baking, thereby forming the source electrodes 4, the source wires 4', the drain electrodes 5 and the pixel electrodes 7 (FIG. 5C). Then, a polythiophene type organic semiconductor solution was printed to the resultant object by flexographic printing, followed by baking, thereby forming the semiconductor layer 6 (FIG. 5D). In addition, a fluorine-based resin solution was screen-printed to the resultant object, followed by baking, thereby forming the protective layer 6' (FIG. 5E).

Then, an epoxy solution was screen-printed to the resultant object, followed by baking, thereby forming the interlayer insulating layer 8 (FIG. 5F). Then, Ag paste was screen-printed to the resultant object, followed by baking, thereby forming the upper pixel electrodes 9 (FIG. 5G), for completion of the thin-film transistor array 200.

Separately, using a PEN substrate as a counter substrate 30, ITO was sputtered thereon to form the counter electrode. Then, a polymer dispersed liquid-crystal material was placed between the counter electrode 31 side of the counter substrate 30 and the thin-film transistor array section, as the display medium 32, followed by UV-curing (FIG. 5H).

A plurality of panels were prepared through the same steps, and were driven at a frame time of 16.7 ms. The number of pixels was 640×480, the storage capacitance was 1 pF per pixel, the gate voltage was +10 V (when not selected) or −10 V (when selected), and the capacitor voltage was the same as the counter voltage and was +3 V. The maximum allowable current of the gate drivers was about 5 mA. A proper display was obtained in panels in which there was no short-circuiting between gate wires 2' and capacitor wires 10'. In some panels, there was a short-circuiting 20 between gate wire 2' and capacitor wire 10', so the display quality was poor. However, the gate power supply, the gate drivers, and the capacitor power supply 11 did not fail and could be used for other normal panels.

Example 3

As Example 3, the thin-film transistor array 200 illustrated in FIG. 4 was prepared through the steps illustrated in FIGS. 6A to 6G. First, using a PEN substrate as the insulating substrate 1, Ag ink was offset-printed thereto, followed by baking, thereby forming the source electrodes 4, the source wires 4', the drain electrodes 5 and the pixel electrodes 7 (FIG. 6A).

Then, a polythiophene type organic semiconductor solution was printed to the resultant object by flexographic printing, followed by baking, thereby forming the semiconductor layer 6 (FIG. 6B).

Then, a photoresist was applied to the resultant object by spin coating, followed by exposure, development and baking, thereby forming the gate insulating film 3 (FIG. 6C).

Then, Ag ink was offset-printed to the resultant object, followed by baking, thereby forming the gate electrodes 2, the gate wires 2', the capacitor electrodes 10, the capacitor wires 10' and the resistor 12 (FIG. 6D). The resistance of the resistor 12 was 10 kΩ.

Then, an epoxy solution was screen-printed to the resultant object, followed by baking, thereby forming the interlayer insulating layer 8 (FIG. 6E). Then, Ag paste was screen-printed to the resultant object, followed by baking, thereby forming the upper pixel electrodes 9 (FIG. 6F), for completion of the thin-film transistor array 200.

Separately, using a PEN substrate as a counter substrate 30, ITO was sputtered thereon to form the counter electrode. Then, a polymer dispersed liquid-crystal material was placed between the counter electrode 31 side of the counter substrate 30 and the thin-film transistor array section, as the display medium 32, followed by UV-curing (FIG. 6G).

A plurality of panels were prepared through the same steps, and were driven at a frame time of 16.7 ms. The number of pixels was 640×480, the storage capacitance was 1 pF per pixel, the gate voltage was +10 V (when not selected) or −10 V (when selected), and the capacitor voltage was the same as the counter voltage and was +3 V. The maximum allowable current of the gate drivers was about 5 mA. A proper display was obtained in panels in which there was no short-circuiting between gate wires 2' and capacitor wires 10'. In some panels, there was a short-circuiting 20 between gate wire 2' and capacitor wire 10', so the display quality was poor. However, the gate power supply, the gate drivers, and the capacitor power supply 11 did not fail and could be used for other normal panels.

Comparative Example 1

Except for not inserting the resistor 12, a thin-film transistor array was prepared through the same steps as in Example 1. The resistance of the capacitor wires 10' from the portion where the capacitor wires 10' were bundled into a strand to the capacitor power supply portion 10s was measured using a tester and found to be 50Ω.

A plurality of panels were prepared through the same steps, and were driven in the same way. Proper display was obtained in panels in which there was no short-circuiting between the gate wires 2' and the capacitor wires 10'. However, in some of the panels, there was short-circuiting 20 between the gate wires 2' and the capacitor wires 10', so the gate power supply, the gate drivers or the capacitor power supply 11 failed.

Comparative Example 2

Except for the resistance of the resistor 12 being 100 kΩ, a thin-film transistor array was prepared through the same steps as in Example 1.

A plurality of panels were prepared through the same steps, and were driven in the same way. Even when there was a short-circuiting 20 between gate wire 2' and capacitor wire 10', the gate power supply, the gate drivers and the capacitor power supply 11 did not fail. However, proper display was not obtained even when there was no short-circuiting between the gate wires 2' and capacitor wires 10'.

As described above, embodiments of the present invention are a thin-film transistor array and a method for manufacturing the same, which achieve low-temperature processing at low cost by using a printing method, while preventing troubles in gate drivers or power supplies due to short-circuiting between gate wires and capacitor wires to enable reuse of the gate drivers and power supply.

This application addresses the following: When short-circuiting occurs between a gate wire and a capacitor wire, large current flows to the gate driver, and may cause a problem of causing the gate driver or the power supply to fail. This problem, which does not occur when the electrodes are formed through photolithography, is unique to the manufacture of thin-film transistor arrays through printing.

As such, the embodiments of the present invention include a thin-film transistor array in which the gate driver or the power supply does not fail even when short-circuiting occurs between the gate wire and the capacitor wire, and a method for manufacturing the thin-film transistor array.

One aspect of the present invention is a thin-film transistor array including: an insulating substrate; a gate insulating film; a gate electrode, a gate wire connected to the gate electrode, a capacitor electrode, and a capacitor wire connected to the capacitor electrode, all of which sandwich the gate insulating film, with a source electrode, a source wire connected to the source electrode, a drain electrode, and a pixel electrode connected to the drain electrode. In the thin-film transistor array, the pixel electrode is laid over the capacitor electrode via the gate insulating film to have a storage capacitance; the source electrode and the drain electrode are laid over the gate electrode via the gate insulating film; a semiconductor layer is provided between the source electrode and the drain electrode; and a resistor is provided in part of the capacitor wire.

The gate electrode, the gate wire connected to the gate electrode, the capacitor electrode and the capacitor wire connected to the capacitor electrode may be formed under (near the insulating substrate) the source electrode and drain electrode (bottom-gate type), or over them (top-gate type).

At least the gate electrode, the gate wire, the capacitor electrode and the capacitor wire may be made of the same material.

The resistor may have an electrical resistance which is smaller than a value obtained by dividing a frame time by overall storage capacitances connected to the capacitor wires.

The resistor may have an electrical resistance which is larger than a value obtained by dividing an absolute value of a voltage across the gate wire and the capacitor wire by a maximum allowable output current of a gate driver.

The resistor may be a long wiring portion provided in part of the capacitor wire.

The resistor may be a separate element provided in part of the capacitor wire.

Another aspect of the present invention is a method for manufacturing a thin-film transistor array, including steps of: forming, on top of an insulating substrate by printing, a gate electrode, a gate wire connected to the gate electrode, a capacitor electrode and a capacitor wire connected to the capacitor electrode; forming a gate insulating film; forming, sandwiching the gate insulating film, a source electrode, a source wire connected to the source electrode, a drain electrode, and a pixel electrode connected to the drain electrode; and forming a semiconductor layer between the source electrode and the drain electrode.

The gate electrode, the gate wire connected to the gate electrode, the capacitor electrode and the capacitor wire connected to the capacitor electrode may be under (near the insulating substrate) the source electrode and drain electrode (bottom-gate type), or over them (top-gate type).

In the step of forming the resistor, a long wiring portion serving as the resistor may be formed concurrently with the capacitor wire.

In the step of forming the resistor, a separate element serving as the resistor may be provided after the step of forming the capacitor wire.

According to embodiments of the present invention, a gate driver or a power supply is prevented from failing due to short-circuiting between a gate wire and a capacitor wire, while achieving low-temperature processing at low cost by using a printing method. Thus, the present invention can provide a thin-film transistor array enabling reuse of the gate driver or the power supply.

INDUSTRIAL APPLICABILITY

The embodiments of the present invention are useful for thin-film transistor arrays and the like.

DESCRIPTION OF REFERENCE SIGNS

1 Insulating substrate
2 Gate electrode
2' Gate wire
3 Gate insulating film
4 Source electrode
4' Source wire
5 Drain electrode
6 Semiconductor layer
6' Protective layer
7 Pixel electrode
8 Inter-layer insulating film
9 Upper pixel electrode
10 Capacitor electrode
10' Capacitor wire
10s Capacitor power supply portion
11 Capacitor power supply
11a Common power supply
12 Resistor
13 Flexible printed wiring board
14 Gate driver
20 Short-circuit section
30 Counter substrate
31 Counter electrode
32 Display medium
100, 200, 500 Thin-film transistor array Obviously, numerous modifications and variations of the present invention are possible in light of the above teachings. It is therefore to be understood that within the scope of the appended claims, the invention may be practiced otherwise than as specifically described herein.

What is claimed is:

1. A thin-film transistor array, comprising:
an insulating substrate;
a gate insulating film sandwiched between a first structure and a second structure, the first structure including a gate electrode, a gate wire connected to the gate electrode, a capacitor electrode and a capacitor wire connected to the capacitor electrode, and the second structure including a source electrode, a source wire connected to the source electrode, a drain electrode, and a pixel electrode connected to the drain electrode;
a resistor inserted between parts of the capacitor wire; and
a semiconductor layer formed between and over the source electrode and the drain electrode,
wherein the pixel electrode is positioned over the capacitor electrode with the gate insulating film positioned therebetween and has a storage capacitance, and
the source electrode and the drain electrode are positioned over the gate electrode with the gate insulating film positioned therebetween.

2. The thin-film transistor array of claim 1, wherein the gate electrode, the gate wire, the capacitor electrode and the capacitor wire are formed on the insulating substrate, the gate insulating film is formed on the insulating substrate, the gate electrode, the gate wire, the capacitor electrode and the capacitor wire, and
the source electrode, the source wire, the drain electrode and the pixel electrode are formed on the gate insulating film.

3. The thin-film transistor array of claim 1, wherein the source electrode, the source wire, the drain electrode and the pixel electrode are formed on the insulating substrate, the gate insulating film is formed on the insulating substrate, the source electrode, the source wire, the drain electrode, and the pixel electrode, and
the gate electrode, the gate wire, the capacitor electrode, and the capacitor wire are formed on the gate insulating film.

4. The thin-film transistor array of claim 1, wherein the gate electrode, the gate wire, the capacitor electrode, and the capacitor wire comprise the same material.

5. The thin-film transistor array of claim 1, wherein the resistor has an electrical resistance which is smaller than a value obtained by dividing a frame time by overall storage capacitances connected to the capacitor wires.

6. The thin-film transistor array of claim 1, wherein the resistor has an electrical resistance which is larger than a value obtained by dividing an absolute value of a voltage across the gate wire and the capacitor wire by a maximum allowable output current of a gate driver.

7. The thin-film transistor array of claim 1, wherein the resistor is a long wiring portion inserted between parts of the capacitor wire.

8. The thin-film transistor array of claim 1, wherein the resistor is a separate element inserted between parts of the capacitor wire.

9. An image display device, comprising:
the thin-film transistor array of claim 1.

10. A method for manufacturing a thin-film transistor array, comprising:
forming, on an insulating substrate by printing, a gate electrode, a gate wire connected to the gate electrode, a capacitor electrode, and a capacitor wire connected to the capacitor electrode;
forming a resistor between parts of the capacitor wire;
forming a gate insulating film on the gate electrode, the gate wire, the capacitor electrode, and the capacitor wire;
forming, on the gate insulating film, a source electrode, a source wire connected to the source electrode, a drain electrode, and a pixel electrode connected to the drain electrode; and
forming a semiconductor layer between and on the source electrode and the drain electrode.

11. A method for manufacturing a thin-film transistor array, comprising:
forming, on an insulating substrate, a source electrode, a source wire connected to the source electrode, a drain electrode, and a pixel electrode connected to the drain electrode;
forming a semiconductor layer between and on the source electrode and the drain electrode;
forming a gate insulating film on the source electrode, the source wire, the drain electrode, and the pixel electrode such that the gate insulating film has an opening over the pixel electrode;
forming, on the gate insulating film by printing, a gate electrode, a gate wire connected to the gate electrode, a capacitor electrode, and a capacitor wire connected to the capacitor electrode;

forming a resistor between parts of the capacitor wire;

forming an inter-layer insulating film on the gate insulating film, the gate electrode, the gate wire, the capacitor electrode, and the capacitor wire such that the inter-layer insulating film has an opening over the opening of the gate insulating film; and forming an upper pixel electrode on the inter-layer insulating film.

12. The method of claim 10, wherein, the forming of the resistor comprises forming a long wiring portion as the resistor concurrently with the capacitor wire.

13. The method of claim 10, wherein, the forming of the resistor comprises forming a separate element as the resistor after the forming of the capacitor wire.

14. The thin-film transistor array of claim 1, wherein a top surface of the semiconductor layer is entirely above a plane corresponding to a highest surface of the source electrode and a highest surface of the drain electrode.

\* \* \* \* \*